United States Patent [19]

Matsumoto et al.

[11] Patent Number: 4,748,422
[45] Date of Patent: May 31, 1988

[54] AMPLIFIER CIRCUIT SUITABLE FOR USE AS AN ACTIVE FILTER CIRCUIT

[75] Inventors: Shuzo Matsumoto, Fujisawa; Tomomitsu Kuroyanagi, Yokohama; Yukinari Ueki, Yokohama; Masanori Kamiya, Yokohama, all of Japan

[73] Assignee: Hitachi, Ltd., Tokyo, Japan

[21] Appl. No.: 770

[22] Filed: Jan. 6, 1987

[30] Foreign Application Priority Data

| Jan. 10, 1986 | [JP] | Japan | 61-2016 |
| Jan. 10, 1986 | [JP] | Japan | 61-2044 |
| Apr. 25, 1986 | [JP] | Japan | 61-94491 |
| May 21, 1986 | [JP] | Japan | 61-114541 |

[51] Int. Cl.$^4$ ............................................. H03F 3/45
[52] U.S. Cl. ..................................... 330/252; 330/260
[58] Field of Search ............... 330/252, 257, 260, 261

[56] References Cited

U.S. PATENT DOCUMENTS 4,555,670  11/1985  Tanaka ............................... 330/252

Primary Examiner—Gene Wan
Attorney, Agent, or Firm—Antonelli, Terry & Wands

[57] ABSTRACT

An amplifier suitable for use as an active filter such as a low-pass filter, a high-pass filter or a phase shifter, which can be easily formed as part of an integrated circuit. The amplifier includes first and second transistors, which together form a first differential amplifier for converting the voltage of the input signal thereto to a signal current. It also includes third and fourth transistors, which together form a second differential amplifier for dividing the signal current from the second transistor in a given ratio. A capacitor is connected to the collector of the fourth transistor, and first and second resistors are connected, respectively, to emitters of the first and second transistors. The current division ratio of the current flowing through the third and fourth transistors is controlled by a control voltage DC supplied to the base of the third transistor and the base of the fourth transistor. In the amplifier, the signal current shunted in the current division ratio K between the third and fourth transistors flow through the load capacitor so that the time constant of the active filter is controlled, the ratio K being controlled by the control voltage $V_c$. The control voltage $V_c$ also compensates for the inaccuracy of the values of the resistors and capacitors.

7 Claims, 9 Drawing Sheets

4,748,422

AMPLIFIER CIRCUIT SUITABLE FOR USE AS AN ACTIVE FILTER CIRCUIT

BACKGROUND OF THE INVENTION

This invention relates to an amplifier circuit, and particularly to an amplifier circuit suitable for use as an active filter circuit, which can be easily formed into an integrated circuit (IC).

When an attempt is made to allow an IC (integrated circuit) to comprise such circuits including filters as integrator and phase shift circuits, it is important how these filters should be formed in the IC so as to decrease the number of components to be externally connected. As filters for use in an integrated circuit, active filters are usually used. However, disadvantages of a conventional active filter are:

(1) it is difficult to form its resistors and capacitors with accurate values, causing errors in its cut-off frequency which is determined by the product of these values; and (2) it is difficult to form a circuit with a lower cut-off frequency because resistors and capacitors are limited to have relatively low values.

Conventional active filters are disclosed in JP-A-55-45224 and JP-A-55-45266.

SUMMARY OF THE INVENTION

An amplifier according to the present invention comprises first and second transistors $Q_1$ and $Q_2$, which together form a first differential amplifier for converting the voltage of the input signal thereto to a signal current, third and fourth transistors $Q_3$ and $Q_4$, which together form a second differential amplifier for diving the signal current from the second transistor $Q_2$ at a given division ratio, a capacitor C connected to the collector of the fourth transistor $Q_4$, means connected to the base of the third transistor $Q_3$ or fourth transistor $Q_4$, said means responsive to a control voltage $V_c$ thereto to control the current division ratio for the currents of the third and fourth transistors $Q_3$ and $Q_4$, and first and second resistors $R_1$ and $R_2$ connected, respectively, to emitters of the first and second transistors $Q_1$ and $Q_2$. In the amplifier according to the present invention, the signal current shunted in the current division ratio K by the third and fourth transistors $Q_3$ and $Q_4$ flows through the load capacitor C so that the time constant of the active filter is controlled, the ratio K being controlled by the control voltage $V_c$. The control voltage $V_c$ also compensates for the inaccuracy of the values of the resistors and capacitors. The resistors $R_1$ and $R_2$ connected to the emitters of the first and second transistors $Q_1$ and $Q_2$ function to provide the first and second transistors $Q_1$ and $Q_2$ with greater dynamic ranges against the input signal, and also to allow the first and second transistors $Q_1$ and $Q_2$ forming the first differential amplifier to operate constantly at emitter current with increasing transition frequency. This improves the high frequency characteristics of the first differential amplifier.

DESCRIPTION OF THE PREFERRED EMBODIMENTS

Figure 1:
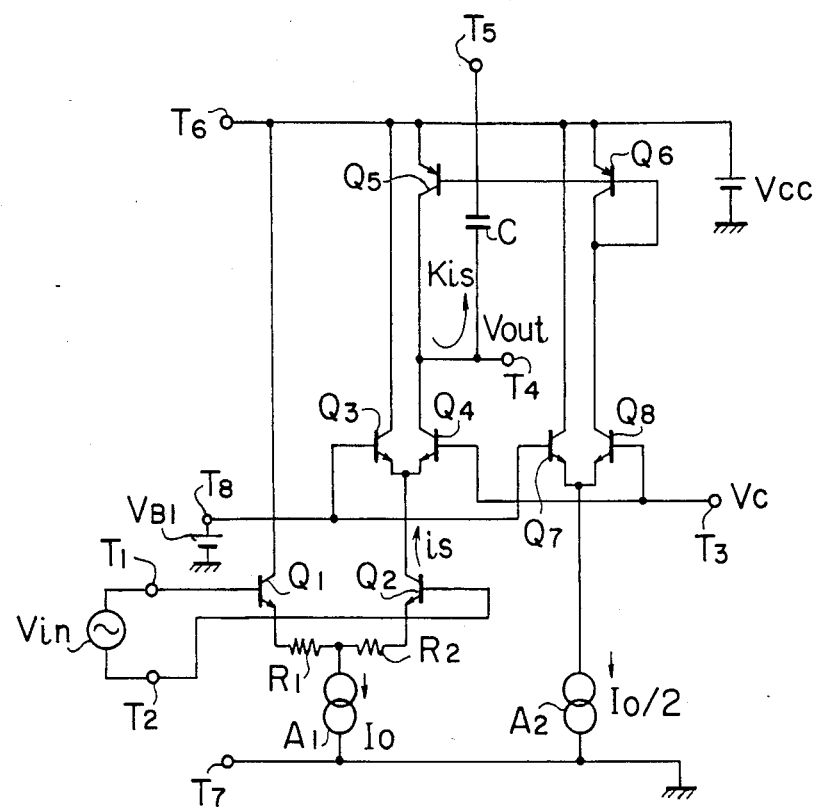
FIGS. 1 and 7 are schematic diagrams of amplifiers according to the present invention.

FIG. 1 shows a schematic diagram illustrating an amplifier according to the present invention.

Referring to FIG. 1, a differential amplifier is composed of a transistor $Q_1$ connected to one end of a resistor $R_1$ at its emitter and a transistor $Q_2$ connected to one end of a resistor $R_2$ at its emitter, the other ends of the resistors being connected to a first regulated current source $A_1$. The base of the transistor $Q_1$ is connected to one input $T_1$, the base of the transistor $Q_2$ is connected to another input $T_2$, and an input signal $V_{in}$ is provided across the inputs $T_1$ and $T_2$. The collector current of the transistor $Q_2$ is shunted by transistors $Q_3$ and $Q_4$, the emitters of which are connected to the collector of the transistor $Q_2$. The transistors $Q_3$ and $Q_4$ together form a differential amplifier. The base of the transistor $Q_3$ is supplied with a bias viltage $V_{B1}$ through a terminal $T_8$, while the base of the transistor $Q_4$ is connected to a terminal $T_3$. The current division ratio in which the current is divided between the transistors $Q_3$ and $Q_4$ is controlled by a control voltage $V_c$ applied to the terminal $T_3$. The collector of the transistor $Q_4$ is connected both to the collector of a transistor $Q_5$ and to a capacitor C. The collector of the transistor $Q_4$ is also connected to a terminal $T_4$ at which an output voltage $V_{out}$ is produced. The capacitor C is connected to a terminal $T_5$. The base of the transistor $Q_5$ is connected to the base and collector of a transistor $Q_6$, and the transistors $Q_5$ and $Q_6$ thus form a current mirror circuit in which the transistors $Q_5$ and $Q_6$ produce substantially the same collector current. Transistors $Q_7$ and $Q_8$ are connected together at their emitters which are connected to a second regulated current source $A_2$. The current from the regulated current source $A_2$ is selected to be half the current $I_0$ from the regulated current source $A_1$, that is, $I_0/2$. The bases of the transistors $Q_7$ and $Q_8$ are connected to the bases of the transistors $Q_3$ and $Q_4$, respectively, and the current division ratio between the transistors $Q_3$ and $Q_4$ is controlled by a control voltage $V_c$ applied to the terminal $T_3$. Therefore, the collector currents of the transistors $Q_4$ and $Q_8$ are substantially equal, and the collector currents of the transistors $Q_3$ and $Q_7$ are substantially equal.

Figure 2:
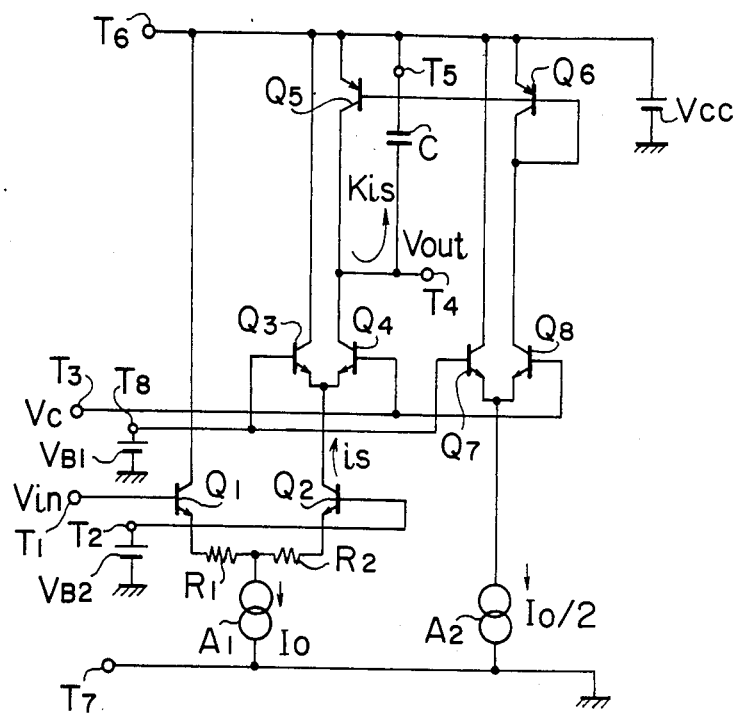
FIGS. 2 and 8 are schematic diagrams of amplifiers according to the present invention, which are intended for use as integrators.

FIG. 2, in which like reference numerals represent like elements as in FIG. 1, shows a circuit wherein another bias voltage $V_{B2}$ is applied to the terminal $T_2$ with the terminals $T_5$ and $T_6$ being connected together.

When an input signal $V_{in}$ is supplied to the terminal $T_1$ in FIG. 2, the collector current $i_s$ of the transistor $Q_2$ driven by the input signal $V_{in}$ is represented by:

$$i_s = \frac{V_{in}}{r_e + r_e + R_1 + R_2} \tag{1}$$

wherein $r_e$ is the emitter resistance of each of the transistors $Q_1$ and $Q_2$.

Let K be the current division ratio (the portion for the collector of $Q_4$) of the current $i_s$ between the transistors $Q_3$ and $Q_4$, then a current $Ki_s$ flows through the capacitor C and produces an output voltage $V_{out}$ at the terminal $T_4$.

$$V_{out} = Ki_s/j\omega C = Ki_s/SC \tag{2}$$

where S is Raplacean, and $\omega$ is the angular frequency of the signal. From the formulas (1) and (2)

$$H_1(S) = \frac{V_{out}}{V_{in}} = \frac{K}{SC(R_1 + R_2 + 2R_e)} \tag{3}$$

This indicates that the circuit shown in FIG. 2 is an integrator, the gain of which is given by $K/C \cdot (R_1+R_2+2r_e)$. The emitter resistance $r_e$ is a function of the emitter current $I_E$ and given by $$r_e = kT/qI_E \tag{4}$$

where k is Boltzman's costant, T is absolute temperature, and q is electron charge. The emitter resistance $r_E = 260\Omega$ at the emitter current of 100 $\mu$A is obtained at an amlbient (room) temperature.

Figure 3:
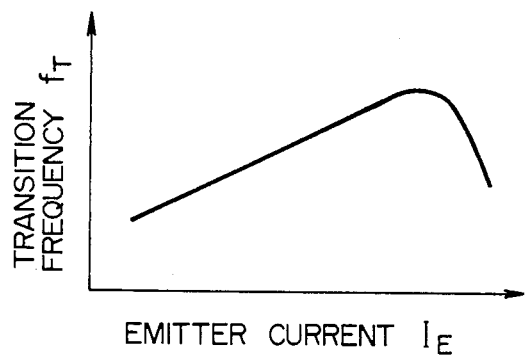
FIG. 3 is diagram illustrating a relationship between the transition frequency and emitter current of a transistor.

The transition frequency $f_T$, which generally indicates the high frequency performance of a transistor, varies according to the emitter current $I_E$ as shown in FIG. 3. When the emitter current $I_E$ is selected relatively large, the transition frequency $f_T$ increases and thus the high frequency performance improves.

If the integral gain is determined by the emitter resistor $r_e$, the transition frequency $f_T$ decreases. According to the present invention, resistors $R_1$ and $R_2$ and transistors $Q_3$ and $Q_4$ are provided to allow transistors $Q_1$ and $Q_2$ to operate constantly at the emitter currents $I_E$ with increasing transition frequency $f_T$. If the values of the resistors $R_1$ and $R_2$ are both selected to be a resistance value $R_E$ which is sufficiently large compared to the emitter resistance $r_e$, the formula (3) may be practically rewritten as follows:

$$H_1(S) = \frac{K}{SC \cdot 2R_E} \tag{5}$$

which means that the integral gain is determined by the resistors $R_1$ and $R_2$ and the current division ratio K. If there is a change in the integral gain due to inaccuracy of the value of the capacitor C or resistor $R_1$, then the control voltage $V_c$ supplied to the control terminal $T_1$ is controlled to control the current division ratio K for the signal current to the collector of the transistor $Q_4$, so that a desired integral gain can be obtained. Further, the resistance $R_E$ serves to provide a greater dynamic range for the input signal, thereby providing the circuit with improved characteristics against distortion and noise. Since the current division ratio K also varies with the bias voltage $V_{B1}$ supplied to the terminal $T_8$, the integral gain may be controlled by the voltage $V_{B1}$ supplied to the terminal $T_8$.

Figure 4:
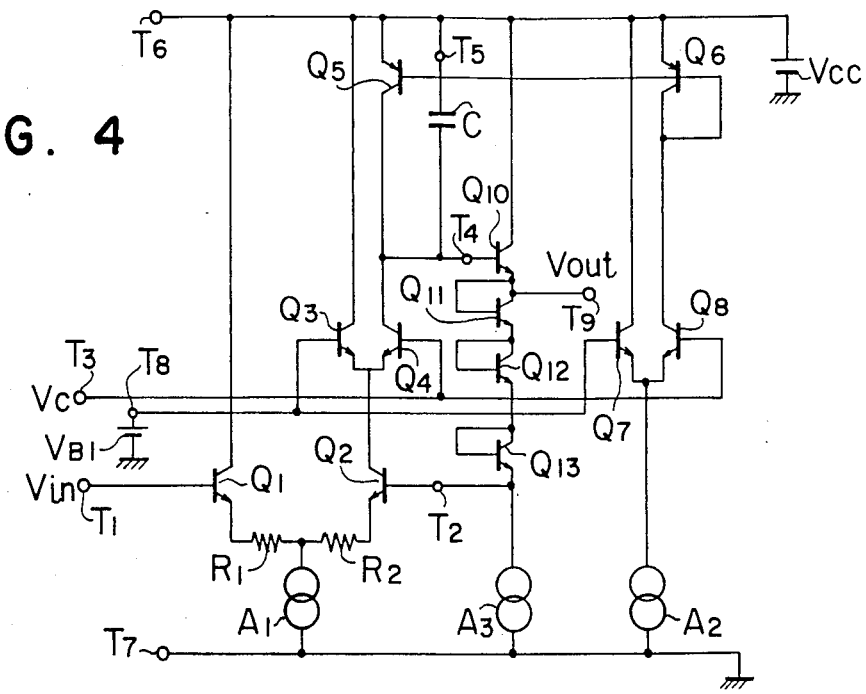
FIGS. 4 and 9 are schematic diagrams of amplifiers according to the present invention, which are intended for use as low-pass filters.

FIG. 4 shows an amplifier according to another embodiment of the present invention, which is intended for use as an integrator. Transistors $Q_{10}$, $Q_{11}$, $Q_{12}$ and $Q_{13}$ and a regulated current source $A_3$ form a DC level shift emitter follower. The integral output from a capacitor C is coupled through a terminal $T_4$ to the base of the transistor $Q_{10}$, which in turn produces at its emitter an output signal $V_{out}$ which appears at a terminal $T_9$. The output signal $V_{out}$ is also supplied through the transistors $Q_{11}$, $Q_{12}$ and $Q_{13}$ to a terminal $T_2$ connected to the base of a transistor $Q_2$, which together form a negative feedback loop.

Therefore, the transfer function $H_2(S)$ of the circuit shown in FIG. 4 is determined by $$H_2(S) = \frac{1}{1 + \frac{SC \cdot 2R_E}{K}} \tag{6}$$

Thus, the circuit shown in FIG. 4 is a low-pass filter with a cut-off frequency $\omega_c$ given by $$\omega_c = \frac{K}{2C \cdot R_E} \tag{7}$$

In this circuit, the inaccuracy of the capacitor C and resistor $R_E$ is perfectly canceled by the current division ratio K being controlled. If the values of the capacitor C and resistor $R_E$ are relatively small, the current division ratio K is selected to be smaller accordingly so that the cut-off frequency $\omega_c$ becomes low. It was difficult to form an IC (integrated circuit) which includes a filter with a relatively low cut-off frequency. According to this invention, however, such an IC can be easily formed by utilizing the integrator having a low value capacitor C and low value resistors $R_1$ and $R_2$ as shown in FIGS. 2 and 4, because the integrator can operate as a filter with a low cut-off frequency.

Figure 5:
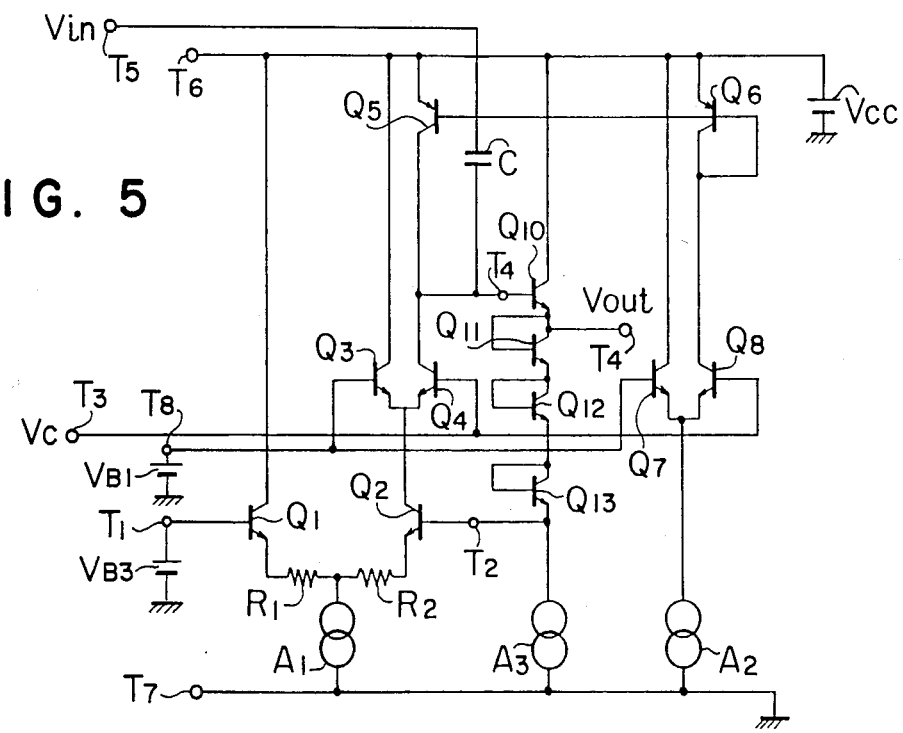
FIGS. 5 and 10 are schematic diagrams of amplifiers according to the present invention, which are intended for use as high-pass filters.

FIG. 5 shows an amplifier according to an embodiment of the present invention, which is intended for use as a high-pass filter. An input signal $V_{in}$ is supplied through a terminal $T_5$ to one end of a load capacitor C, the other end of which is connected to the collector of a transistor $Q_4$. The base of the transistor $Q_1$ is connected to the terminal $T_1$ connected to a bias voltage $V_{B3}$. The transfer function $H_3(S)$ is determined by $$H_3(S) = \frac{1}{1 + \frac{K}{SC \cdot 2R_E}} \tag{8}$$

Thus, the circuit shown in FIG. 5 functions as a high-pass filter.

Figure 6:
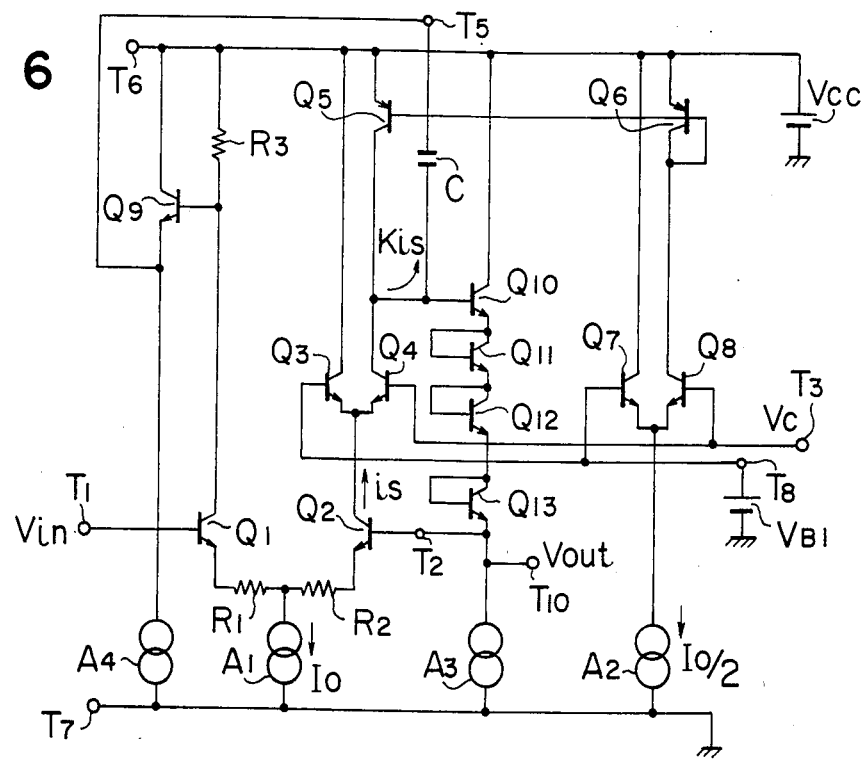
FIGS. 6 and 11 are schematic diagrams of amplifiers according to the present invention, which are intended for use as phase shifters.

FIG. 6 shows an amplifier according to an embodiment of the present invention, which is intended for use as a phase shifter. In this circuit, the collector of the transistor $Q_1$ is connected to a load resistor $R_3$ and the base of a transistor $Q_9$. A regulated current source $A_4$ is connected to the emitter of the transistor $Q_9$, which thus forms an emitter follower. A terminal $T_5$ connected to the capacitor C is connected to the emitter of the transistor $Q_9$. The transistor $Q_{13}$ has an emitter connected to the base of the transistor $Q_2$ through the terminal $T_2$ and also to a terminal $T_{10}$ at which an output signal $V_{out}$ appears. The current $i_s$ through the collector of the transistor $Q_2$ is given by $$i_s = \frac{V_{in} - V_{out}}{r_e + r_e + R_1 + R_2} \quad (9)$$

When the current $i_s$ flows through the capacitor C, a voltage appears across the capacitor C. Simultaneously, a current equal in amount and opposite in phase to the current $i_s$ flows through the collector of the transistor $Q_1$ to the load resistor $R_3$. This current produces a voltage across the resistor $R_3$, and this voltage is then added to the voltage across the capacitor C through the transistor $Q_9$ and capacitor C. The added signal passes through the transistors $Q_{10}$, $Q_{11}$, $Q_{13}$ and $Q_{14}$. Thereafter, this signal turns out to be an output signal $V_{out}$ at a terminal $T_{10}$, and is simultaneously supplied to the base of the transistor $Q_2$ so that a negative feedback loop is formed. The output signal $V_{out}$ is represented by $$V_{out} = \frac{Ki_s}{j\omega C} - R_3 i_s = \frac{Ki_s}{SC} - R_3 i_s \quad (10)$$

where $i_s$ is the angular frequency of the signal. From the formulas (9) and (10), the transfer function $H_4(S)$ of this circuit is $$H_4(S) = \frac{V_{out}}{V_{in}} = \quad (11)$$

$$\frac{-\frac{R_3}{2r_e + R_1 + R_2} S + \frac{K}{C(2r_e + R_1 + R_2)}}{\left(1 - \frac{R_3}{2r_e + R_1 + R_2}\right) S + \frac{K}{C(2r_e + R_1 + R_2)}}$$

In this formula, the term $R_3/(2r_e+R_1+R_e)$ represents the gain of the signal appearing as the voltage across the load resistor $R_3$. If the term is selected to be 0.5, then the denominator and numerator of the formula are equal, that is, the circuit gain is 1 regardless of the input signal frequency, and the circuit shown in FIG. 6 functions as a phase shifter in which only the phase of the output signal varies with a change in frequency.

If the values of the resistors $R_1$ and $R_2$ are selected to be sufficiently larger than the emitter resistance value $r_e$ so that the gain of the signal across the resistor $R_3$ will be determined by the resistors $R_1$, $R_2$ and $R_3$, and if the values of the resistors $R_1$ and $R_2$ are selected to be equal to the value of $R_E$, then the formula (11) is substantially equivalent to $$H_4(S) = \frac{-\frac{R_3}{2R_E} S + \frac{K}{C \cdot 2R_E}}{\left(1 - \frac{R_3}{2R_E}\right) S + \frac{K}{C \cdot 2R_E}} \quad (12)$$

If this phase shifter is formed with inaccurate capacitance C and resistance $R_E$ in an IC, the control voltage $V_c$ supplied to the terminal $T_3$ is controlled to control the current division ratio K for the signal current through the transistor $Q_4$, so that the value of $K/(C2R_E)$ is maintained to be constant. In a single IC (integrated circuit) chip including a plurality of resistors, ratios between their resistance values are substantially equal, so that the gain $R_3(2R_E)$ for the voltage signal across the resistor $R_3$ remains substantially constant.

According to this invention, therefore, the probable inaccuracy of the capacitance and resistance composing the circuit of FIG. 6 in an integrated circuit is compensated for by controlling the current division ratio K between the transistors $Q_3$ and $Q_4$, and the current value from the regulated current source $A_1$ can be selected to a desired value. It is thus possible to select the current value of the regulated current source $A_1$ for an increasing transition frequency $f_T$ of the transistors $Q_1$ and $Q_2$, as shown in FIG. 3. This results in improved characteristics in high frequency regions of the transistors $Q_1$ and $Q_2$.

In the circuit shown in FIG. 1, the output resistance $r_c$ of the transistors $Q_4$ and $Q_5$ on the side of the terminal $T_4$ would be infinitive if they were ideal current source. However, the output resistance $r_c$ of the transistors $Q_4$ and $Q_5$ actually decrease with the increasing collector currents. Especially when formed in an IC chip, the NPN transistor $Q_4$ can have a greater output resistance, but the PNP transistor $Q_5$ can have only a smaller output resistance up to several tens or hundreds of kΩ. This will cause the output signal $V_{out}$ at the terminal $T_4$ to attenuate in the frequency range lower than the frequency determined by the product of the output resistance $r_c$ and the load capacitance C, resulting sometimes in such a problem as the inability of the circuit to operate properly. Circuits as will be described may be used to avoid this problem.

Figure 7:
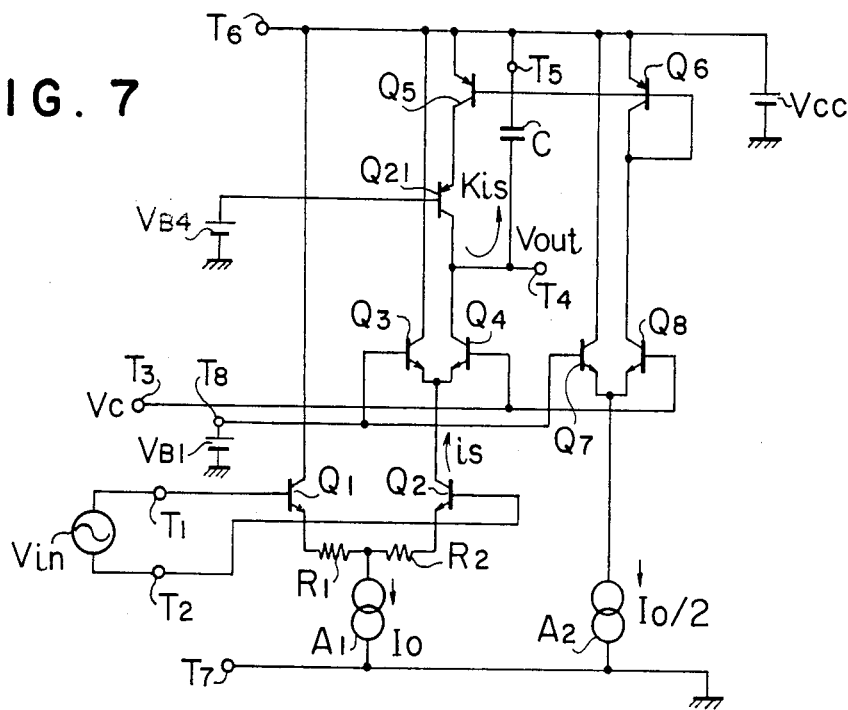

FIG. 7 shows an improved circuit of the amplifier circuit shown in FIG. 1 according to this invention. Referring to FIG. 7, a transistor $Q_{21}$ is connected to the transistor $Q_5$ to form a cascode arrangement. That is, the collector of the transistor $Q_4$ is connected to the collector of the transistor $Q_{21}$. A bias voltage $V_{B4}$ is connected to the base of the transistor $Q_{21}$, the emitter of which is connected to the collector of the transistor $Q_5$, both transistors providing a cascode arrangement. The base of the transistor $Q_5$ is connected to the base and collector of the transistor $Q_6$ so that a current mirror circuit is formed. The collector current of the transistor $Q_5$, which is substantially equal to the collector current of the transistor $Q_6$, passes through the collector of the transistor $Q_{21}$ as a substantially regurated current.

Because of the cascode arrangement of the transistors $Q_5$ and $Q_{21}$, the impedance $Z_o$ of the transistor $Q_{21}$ at the terminal $T_4$ is practically represented by $$Z_o = h_{fe} r_c$$

where $r_c$ and $h_{fe}$ are the output resistance and current amplification factor of the transistor $Q_{21}$, respectively.

Thus, by connecting the PNP transistor $Q_{21}$ in a cascode arrangement as a load current source, the output impedance is increased to $h_{fe}$ times the output resistance $r_e$ of the transistor $Q_{21}$.

Figure 8:
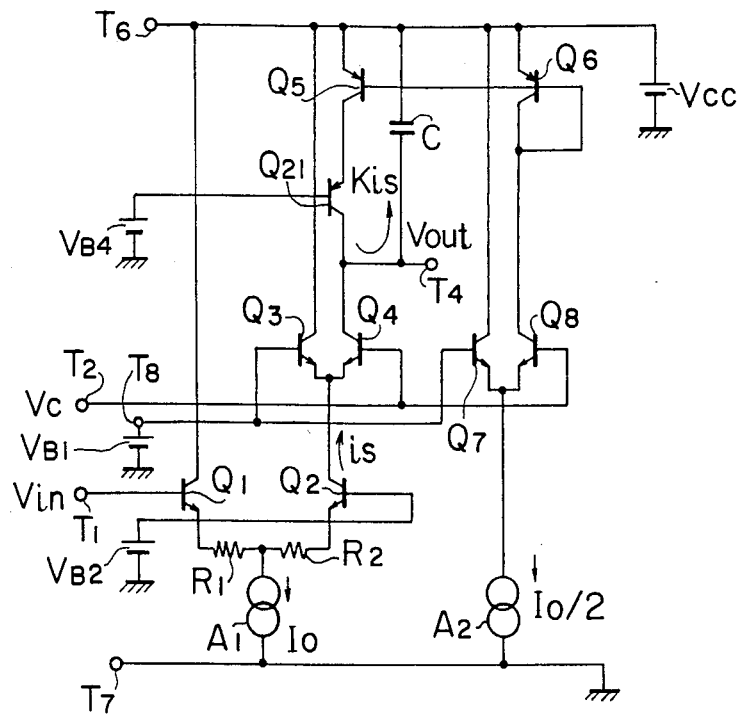

FIG. 8 shows an improved circuit of the integrator shown in FIG. 2. This circuit also comprises a cascode arrangement of the transistors $Q_5$ and $Q_{21}$, and the output impedance is increased to $h_{fe}$ times the output resistance $r_e$ of the transistor $Q_{21}$ by connecting the PNP transistor $Q_{21}$ in a cascode arrangement as a load current source. Therefore, if the output resistance of the transistor $Q_4$ is sufficiently larger than that of the transistor $Q_{21}$, the operating range in low frequencies of the integrator also becomes $h_{fe}$ times greater.

Figure 9:
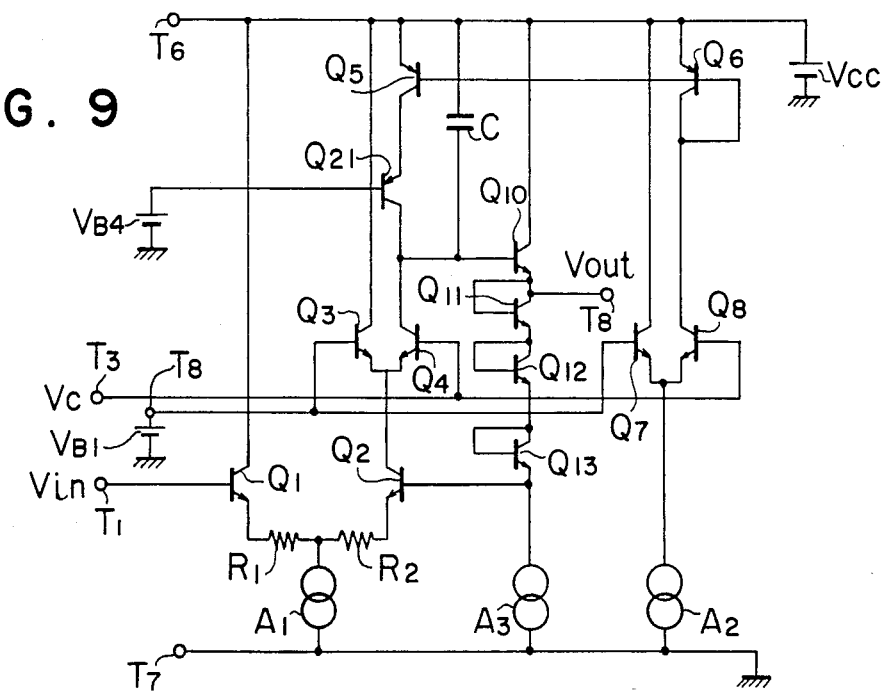

FIG. 9 shows an improved circuit of the low-pass filter shown in FIG. 4. This circuit also comprises a cascode arrangement of the transistors $Q_5$ and $Q_{21}$, and the output impedance is increased to $h_{fe}$ times the output resistance $r_e$ of the transistor $Q_{21}$.

Figure 10:
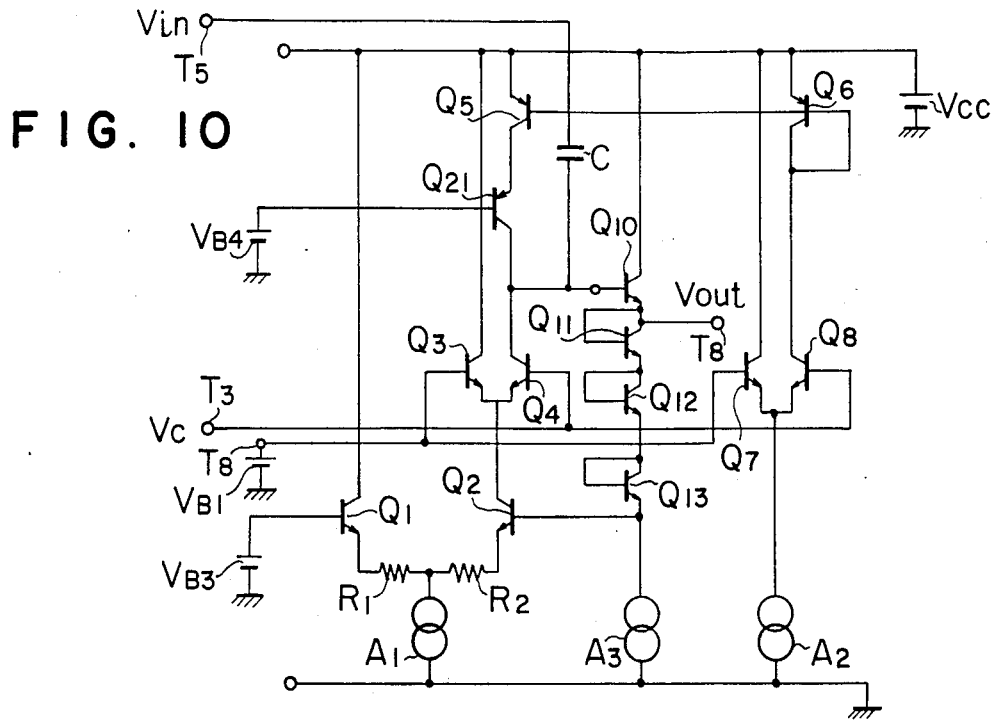

FIG. 10 shows an improved circuit of the high-pass filter shown in FIG. 5. This circuit also comprises a cascode arrangement of the transistors $Q_5$ and $Q_{21}$.

Figure 11:
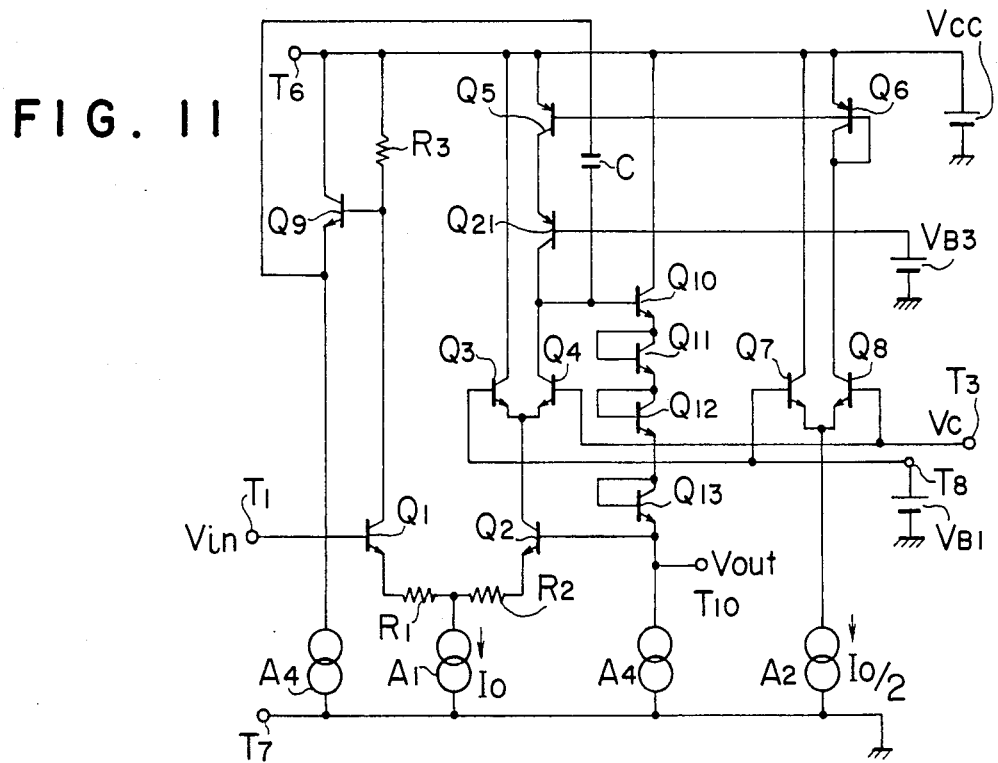

FIG. 11 shows an improved circuit of the phase shifter shown in FIG. 6. This circuit also comprises a cascode arrangement of the transistors $Q_5$ and $Q_{21}$.

Figure 12:
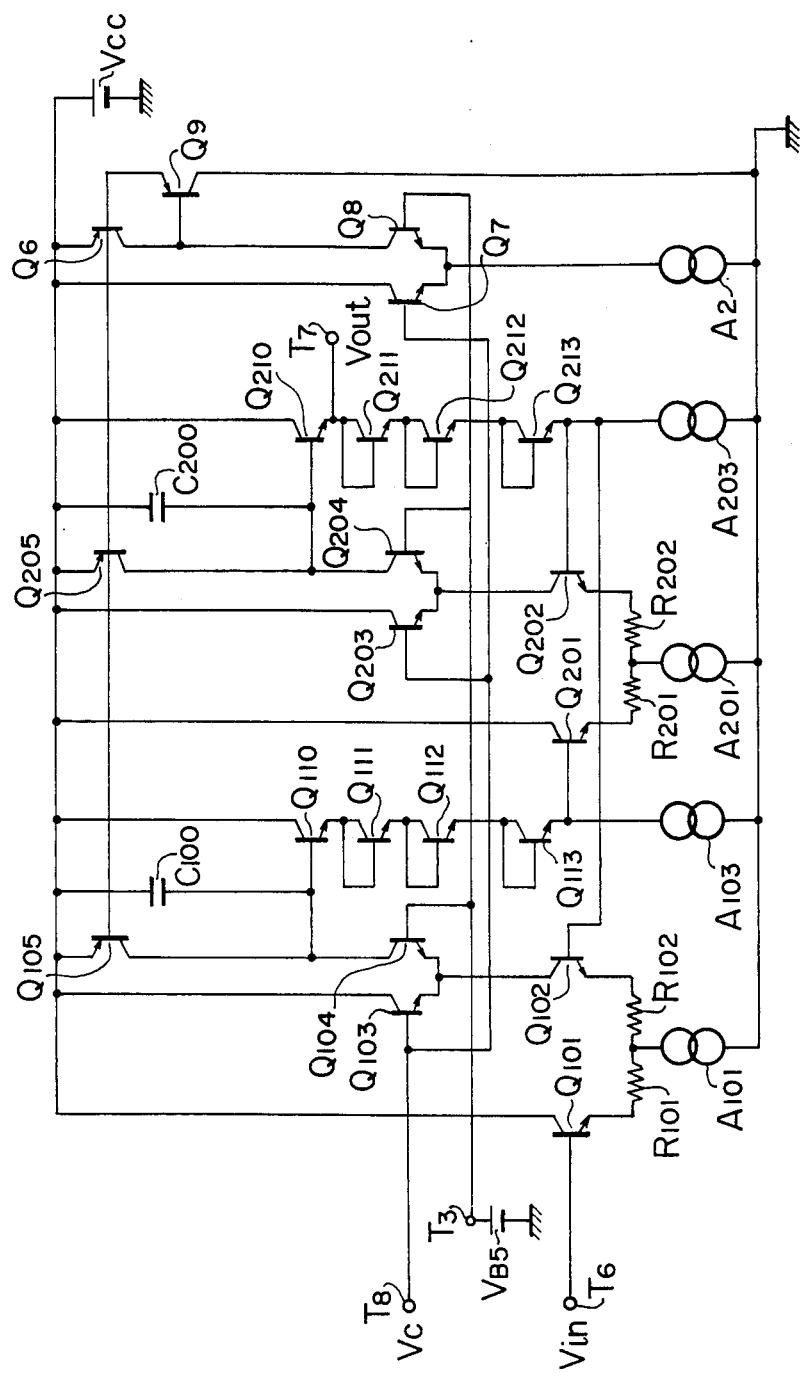
FIGS. 12 and 13 are schematic diagrams of circuits utilizing the low-pass filters shown in FIGS. 4 and 9.
Figure 13:
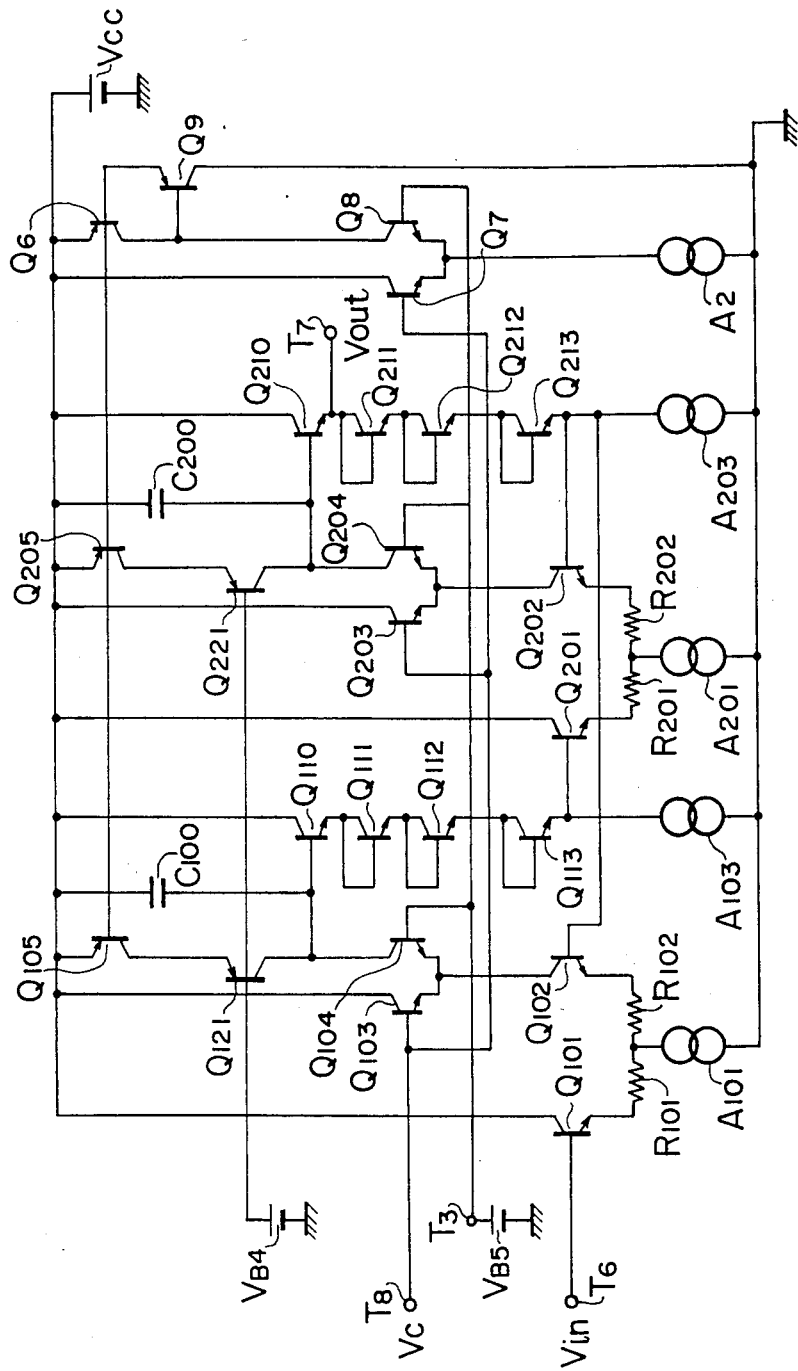

FIGS. 12 and 13 show examples of the application of the low-pass filters shown in FIGS. 4 and 9. Referring to FIG. 12, the circuit comprises two units of the circuit shown in FIG. 4. In FIG. 13, the circuit comprises two units of the circuit shown in FIG. 9. In FIG. 12, a first low-pass filter is composed of transistors $Q_{101}$, $Q_{102}$, $Q_{103}$, $Q_{104}$, $Q_{105}$, $Q_{110}$, $Q_{111}$, $Q_{112}$ and $Q_{113}$, current sources $A_{101}$ and $A_{103}$, resistors $R_{101}$ and $R_{102}$, and a capacitor $C_{100}$, while a second low-pass filter is composed of transistors $Q_{201}$, $Q_{202}$, $Q_{203}$, $Q_{204}$, $Q_{205}$, $Q_{210}$, $Q_{211}$, $Q_{212}$, and $Q_{213}$, current sources $A_{201}$ and $A_{203}$, resistors $R_{201}$ and $R_{202}$, and a capacitor $C_{200}$. In FIG. 13, additional transistors $Q_{121}$ and $Q_{221}$ are provided in the first and second low-pass filters, respectively. In FIGS. 12 and 13, the current division ratio K between the transistors $Q_{103}$ and $Q_{104}$ and between the transistors $Q_{203}$ and $Q_{204}$ is controlled by the control voltage applied to the terminal $T_8$, and a bias voltage $V_{B5}$ is applied to the terminal $T_3$.

Figure 14:
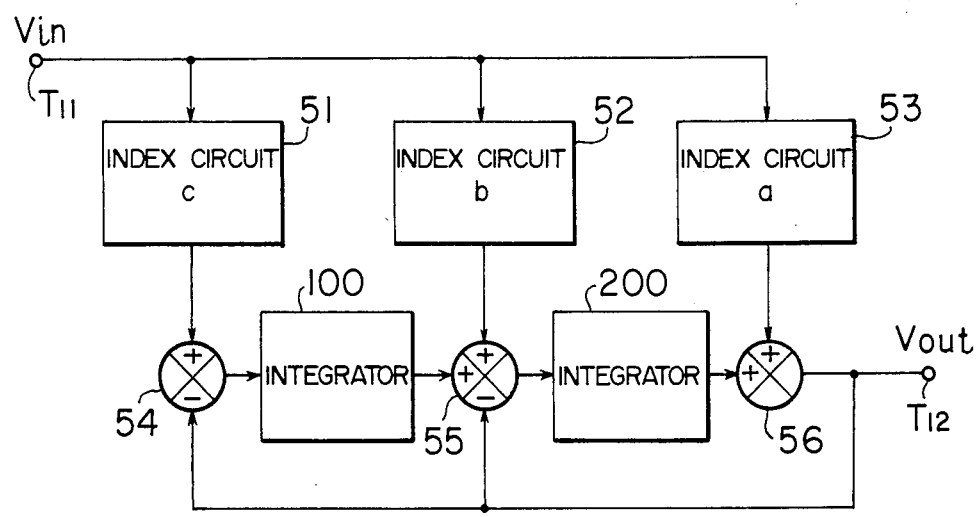
FIG. 14 is a block diagram illustrating a typical filter.

FIG. 14 shows a typical block diagram of the circuits shown in FIGS. 12 and 13. Referring to FIG. 14, an input terminal $T_{11}$ is connected to index circuits 51, 52 and 53, the outputs of which are connected to arithmetic circuits 54, 55 and 56, respectively. An integrator 100 is connected between the arithmetic circuits 54 and 55, and an integrator 200 is connected between the arithmetic circuits 55 and 56. The arithmetic circuits 54, 55 and 56 are connected to an output terminal $T_{12}$. The transfer function $H_5(S)$ of the circuit shown in FIG. 14 is given by $$H_5(S) = \frac{aS^2 + bG_2S + cG_1G_2}{S^2 + G_2S + G_1G_2} \quad (13)$$

where $G_1$ and $G_2$ are integral gains of the integrators 100 and 200, respectively, and c, b and a are factors of the index circuits 51, 52 and 53. The circuit shown in FIG. 14 functions as a low-pass, high-pass or bandpass filter according to the values of the factors a, b and c.

In the circuits shown in FIGS. 12 and 13, the integrators 100 and 200 comprise the first and second low-pass filters, respectively. The factors fo the index circuits 51, 52 and 53 are selected to be a=0, b=0 and c=1. Therefore, the transfer function of the circuits shown in FIGS. 12 and 13 is given by $$H_6(S) = \frac{\frac{K^2}{4C_{100}C_{200}R_{E1}R_{E2}}}{S^2 + \frac{K}{2C_{200}R_{E2}}S + \frac{K^2}{4C_{100}C_{200}R_{E1}R_{E2}}} \quad (14)$$

which is derived from the formula (13). The circuits shown in FIGS. 12 and 13 have low-pass characteristics of the second order. In the folmula (14), $R_{E1}$ is the resistance of the resistors $R_{101}$ and $R_{102}$, and $R_{E2}$ is the resistance of the resistors $R_{201}$ and $R_{202}$. The transistor $Q_9$ compensates for the base current to assure the current mirror operation of the transistor $Q_6$.

As described above, this invention provides an amplifier suitable for use as an acrive filter such as a low-pass filter, high-pass filter or phase shifter, which can be easily formed as part of an integrated circuit.

We claim:
1. An amplifier comprising:
   a first differential amplifier circuit including first and second transistors, a first resistor connected to an emitter of said first transistor, a second resistor connected to an emitter of said second transistor, a first input terminal connected to a base of said first transistor, a second input terminal connected to a base of said second transistor, and a first current source connected to said first and second resistors to pass a current ($I_0$) therethrough;
   a second differential amplifier circuit including third and fourth transistors to divide a current flowing through said second transistor, said third and fourth transistors having their respective emitters connected to the collector of said second transistor;
   a capacitor having one end connected to the collector of said fourth transistor and another end connected to a third input terminal;
   a control voltage input terminal connected to said second differential amplifier to receive a control voltage $V_c$ for determining a current division ratio K for the currents flowing through said third and fourth transistors;
   a current mirror circuit including fifth and sixth transistors which are interconnected in parallel both at their emitters and at their bases, said fifth transistor connected at its collector to the collector of said fourth transistor; and
   a third differential amplifier including seventh and eighth transistors, a second current source connected to emitters of said seventh and eighth transistors for providing a current (approximately $I_0/2$), wherein the collectors of said eighth and sixth transistors are interconnected, the bases of said seventh and third transistors are interconnected, and the bases of said eighth and fourth transistors are interconnected.

2. An amplifier according to claim 1, wherein an input signal is supplied to said first input terminal, a bias voltage ($V_{B2}$) is supplied to said second input terminal, and said third input terminal connected to said capacitor is connected to a power source terminal or a ground terminal.

3. An amplifier according to claim 1, further comprising a negative feedback circuit including
   a tenth transistor having a base connected to the collector of said fourth transistor; and
   an eleventh transistor connected between the emitter of said tenth transistor and said second input terminal of said first differential amplifier circuit.

4. An amplifier according to claim 3, wherein said third input terminal connected to said capacitor is connected to a power source terminal or a ground terminal, and an input signal $V_{in}$ is supplied to said first input terminal.

5. An amplifier according to claim 3, wherein an input signal $V_{in}$ is supplied to said third input terminal connected to said capacitor, and a bias voltage $V_{B3}$ is applied to said first terminal.

6. An amplifier according to claim 3, further comprising:
   a third resistor connected between the collector of said first transistor and said power source terminal; and a ninth transistor having a base connected to the collector of said first transistor, a collector connected to said power source terminal, and an emitter connected to said third input terminal, connected to said capacitor.

7. An amplifier according to claim 1, further comprising a twelfth transistor having an emitter connected to the collector of said fifth transistor, a collector connected to the collector of said fourth transistor and a base adapted to receive a bias voltage $V_{B4}$.

* * * * *